United States Patent
Humphreys et al.

[11] Patent Number: 5,939,911
[45] Date of Patent: Aug. 17, 1999

[54] FREQUENCY PRESCALER METHOD AND APPARATUS RESPONSIVE TO LOW INPUT DRIVE LEVELS

[75] Inventors: Scott Robert Humphreys, Boynton Beach; Darrell Eugene Davis, Sunrise; Barry W. Herold, Delray Beach, all of Fla.

[73] Assignee: Motorola, Inc., Schaumburg, Ill.

[21] Appl. No.: 09/033,619

[22] Filed: Mar. 5, 1998

[51] Int. Cl.⁶ ........................................... H03L 7/06
[52] U.S. Cl. .................... 327/147; 327/115; 327/117; 327/156
[58] Field of Search ..................... 327/115, 117, 327/147, 156, 179; 377/47

[56] References Cited

U.S. PATENT DOCUMENTS

| | | | |
|---|---|---|---|
| 4,368,540 | 1/1983 | Carlson et al. | 455/180 |
| 4,823,123 | 4/1989 | Siwiak | 340/825.44 |
| 4,953,187 | 8/1990 | Herold et al. | 377/48 |
| 5,802,463 | 9/1998 | Zuckerman | 455/208 |

*Primary Examiner*—Margaret R. Wambach
*Attorney, Agent, or Firm*—James A. Lamb

[57] ABSTRACT

A low input prescaler (800) that is responsive to input signals having low amplitude alternating current (AC) components includes a switched tunable prescaler (280) that generates a prescaler output signal (221) having a prescaler output frequency during an operational state of the prescaler and having a free-running frequency that is responsive to a tuning control signal (216) during a tuning state of the prescaler. A frequency comparator (235) generates a comparator output in response to a difference between a reference frequency and the prescaler output frequency. A prescaler tuner (290, 390) adjusts the tuning control signal in response to the comparator output during the tuning state to minimize the difference between the reference frequency and the prescaler output frequency, and holds the tuning control signal during the operational state. The prescaler is used in phase lock loops (200, 400, 600) and other circuits.

16 Claims, 8 Drawing Sheets

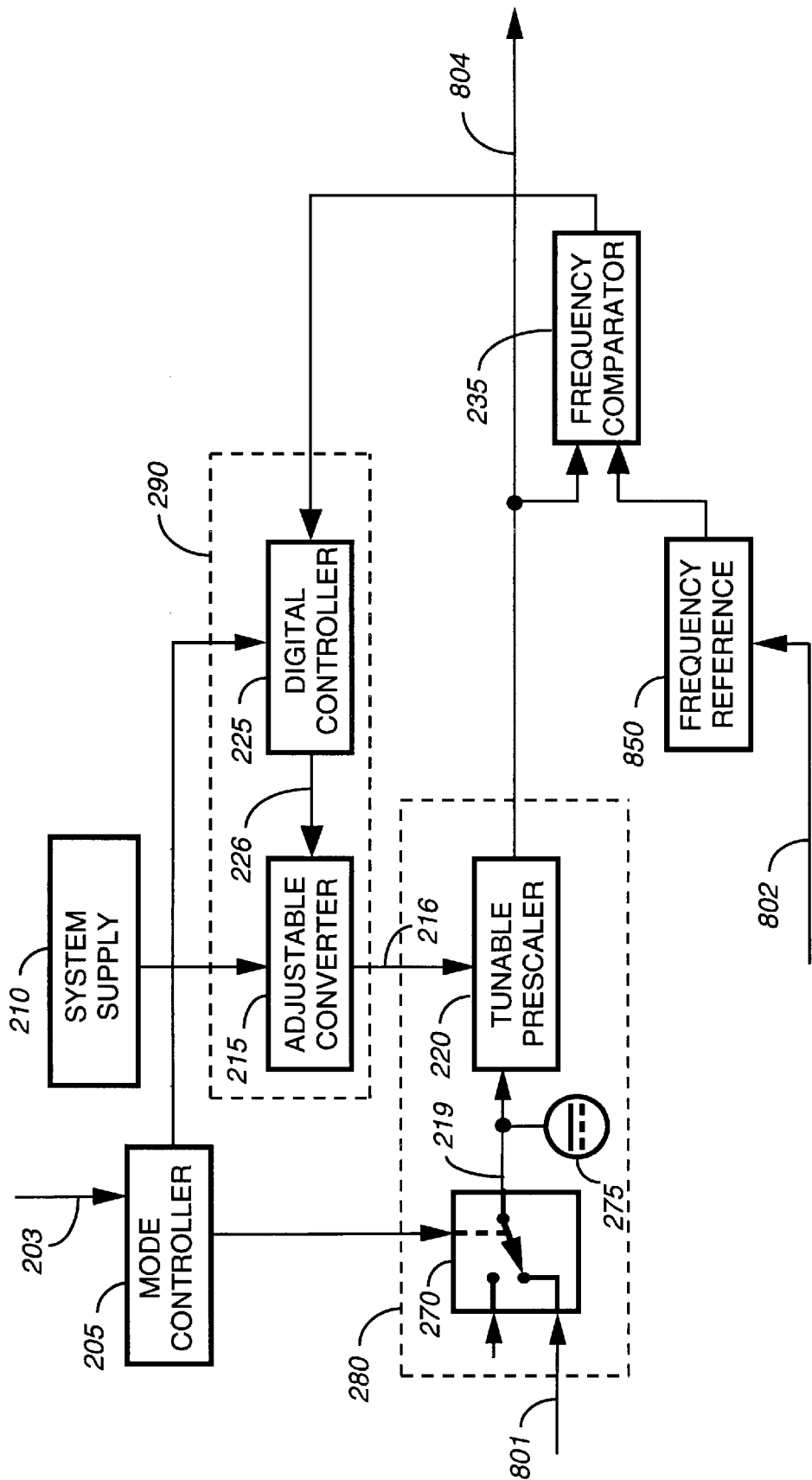

FREQUENCY PRESCALER METHOD AND APPARATUS RESPONSIVE TO LOW INPUT DRIVE LEVELS

FIELD OF THE INVENTION

This invention relates in general to frequency prescalers and in particular to frequency prescalers for prescaling low amplitude signals.

BACKGROUND OF THE INVENTION

Power consumption is a critical design parameter in portable electronic devices such as pagers and broadcast frequency modulation (FM) radio receivers. Power consumption is also important in other electronic devices that operate when plugged into an alternating current (AC) supply, of which an example is a radio controlled electric meter reader.

A circuit that is useful in such devices is a frequency prescaler, which is often used within a phase lock loop. In such a use, the phase lock loop generates an RF signal, such as a local oscillator (LO) signal, and the frequency prescaler performs a frequency division of the LO signal to reduce the frequency to a lower frequency that is within an operational range of other circuits used within the phase lock loop. As an example, a frequency division modulus of 5 is sometimes used.

Conventional prescalers such as the one described in U.S. Pat. No. 4,953,187, issued on Aug. 28, 1990 to Herold et al., and entitled "High Speed Prescaler", have a prescaler input characteristic similar to curve 110 shown in FIG. 1, in which the minimum amplitude of the alternating current (AC) component of a prescaler input signal at which the frequency will be prescaled is plotted for a full range 120 of frequencies over which the prescaler could be operated, under a given set of nominal operating conditions, such as a ambient temperature of 25 degrees centigrade and a nominal power supply voltage. The curve 110 has a minimum value 125 which occurs at a free running frequency of the prescaler; that is, the frequency at which the prescaler self oscillates with an input signal having no alternating current (AC) component. When self-oscillating, the output frequency of the prescaler is equal to the free running frequency divided by the modulus of the prescaler. The curve 110 in FIG. 1 is an example input signal characteristic for the prescaler described in U.S. Pat. No. 4,953,187, that has been designed for a given input signal amplitude range and power supply voltage range. The characteristic shifts significantly with respect to frequency in response to variations of power supply voltage (i.e., curve 110 shifts along the frequency axis) and in response to differences in wafer processing (i.e., wafer lot to wafer lot), and also, but to a lesser extent, with temperature. Maximum shifts 113, 115 of the prescaler input characteristic 110 under combinations of voltage, temperature, and process variation are shown in FIG. 1. Because of the significant shift of the input characteristic, an operational frequency range 130 is established for the prescaler that is narrower than the full range 120 possible at one set of operating conditions. In order to ensure that the prescaler will function with a prescaler input signal over the operational frequency range 130, the prescaler input signal is typically amplified in a buffer amplifier stage having a fixed gain chosen to generate an amplitude that is at least the maximum amplitude 140 required over the operational frequency range 130. Although conventional prescalers are designed to use as little power as possible, the requirement for an input signal that has such a large amplitude results in a buffer amplifier that consumes much more power than the prescaler. It will be appreciated that the amplitude 140 is much higher than needed under most operating conditions. While this approach works well, is it generally wasteful of power.

Thus, what is needed is a means for frequency prescaling that substantially reduces the power consumed to operate conventional prescaler circuits.

BRIEF DESCRIPTION OF THE DRAWINGS

FIG. 8 is an electrical block diagram of a low power tuned prescaler, in accordance with a fifth alternative embodiment of the present invention.

DETAILED DESCRIPTION OF THE DRAWINGS

Figure 2:
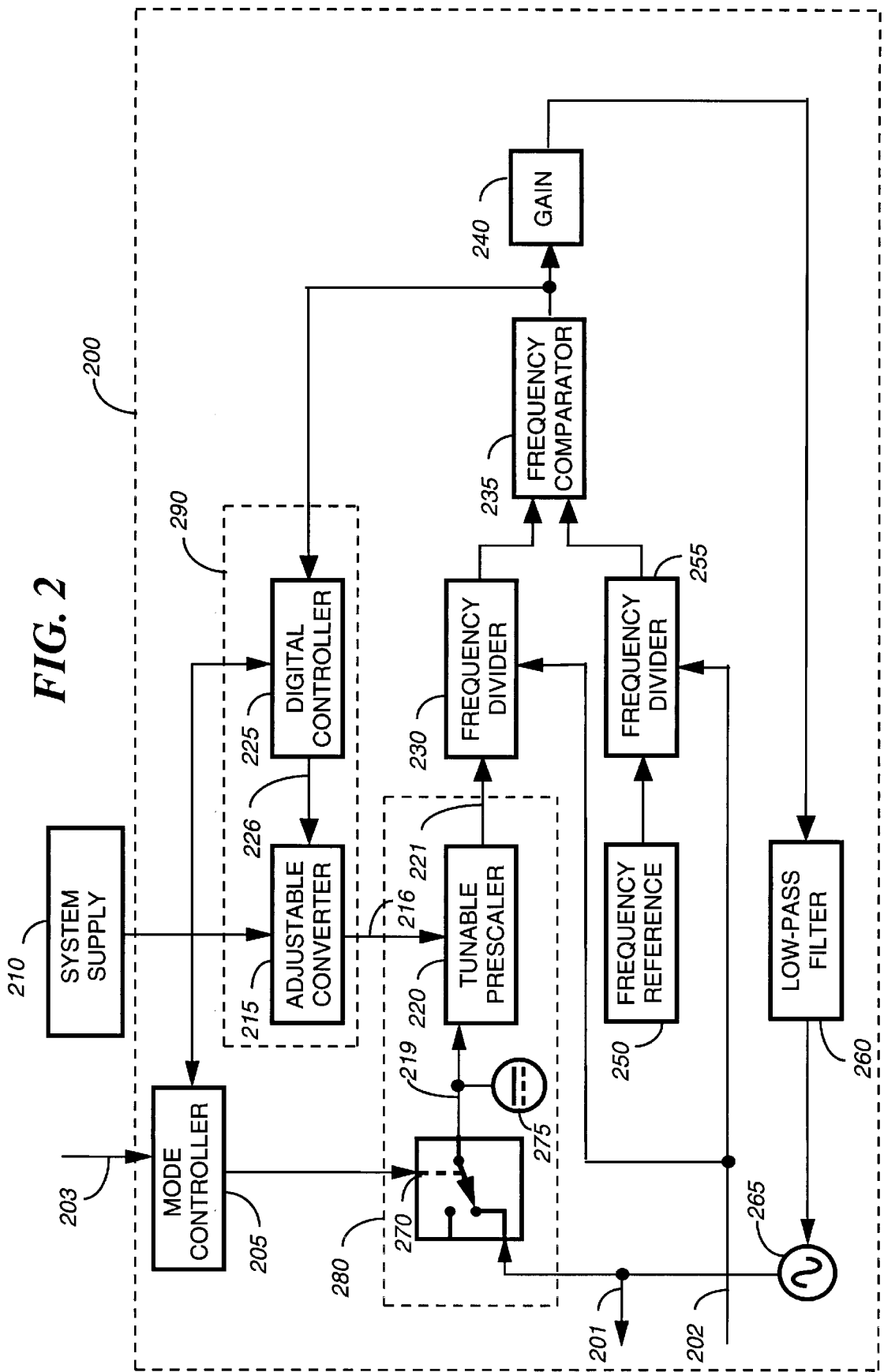
FIG. 2 is an electrical block diagram of a low power phase lock loop, in accordance with the preferred and a first alternative embodiment of the present invention.

Referring to FIG. 2, an electrical block diagram of a low power phase lock loop 200 is shown, in accordance with the preferred and first alternative embodiments of the present invention. The low power phase lock loop 200 is used in a radio 500 (shown in FIG. 5), and comprises a switched tunable prescaler 280, a mode controller 205, a frequency reference 250, a frequency comparator 235, a digital prescaler tuner 290, a controlled oscillator 265, a gain stage 240, and two frequency dividers 230, 255. The switched tunable prescaler 280 generates a prescaler output signal 221 having a prescaler output frequency that is a prescaled frequency of a prescaler input signal 219 that is a controlled oscillator signal 201 when the low power phase lock loop 200 is in an operational mode. When, on the other hand, the low power phase lock loop 200 is in a tuning mode, the prescaler output frequency is a free-running frequency, which is the frequency at which the switched tunable prescaler 280 self oscillates when there is no AC component in the prescaler input signal 219. The free-running frequency is responsive to a tuning control signal 216, as described in more detail below.

The mode controller 205 is coupled to the switched tunable prescaler 280 and sets a mode of the phase lock loop 200 to either the operational state or the tuning state. The mode controller 205 sets the mode of the phase lock loop 200 to the tuning state in response to a retune signal 203 that is generated within the radio 500 upon initial power up and when a sufficiently large change of the frequency of the controlled oscillator signal 201 occurs, such as when the radio 500 changes frequency channels. The phase lock loop 200 remains in the tuning state until the switched tunable prescaler 280 has been tuned, as described in more detail below, and then reverts to the operational state. The frequency reference 250 generates a reference signal having a reference frequency, which is coupled to the frequency divider 255. The frequency reference 250 and the frequency divider 255 are conventional circuits. The prescaler output signal 221 is coupled to frequency divider 230. Outputs of the two frequency dividers 230, 255 are coupled to the frequency comparator 235. Thus, the frequency comparator 235 is ultimately coupled to the switched tunable prescaler 280 and the frequency reference 250. In some alternative embodiments, the prescaler output signal 221 and the frequency reference signal are at frequencies low enough that the frequency dividers 230, 255 are not used, and the frequency comparator 235 is directly coupled to the switched tunable prescaler 280 and the frequency reference 250. The two frequency dividers 230, 255 are conventional logic circuits. The frequency comparator 235, which is a phase-frequency detector of conventional design, generates a comparator output in response to a difference between the reference frequency and the prescaler output frequency.

The digital prescaler tuner 290 is coupled to the frequency comparator 235, the switched tunable prescaler 280, and the mode controller 205. The digital prescaler tuner 290 adjusts the tuning control signal 216 in response to the comparator output during the tuning state to minimize the difference between the reference frequency and the prescaler output frequency, and holds the tuning control signal 216 during the operational state. The output of the frequency comparator 235 is coupled through the gain stage 240 and the low pass filter 260 to the controlled oscillator 265 when the low power phase lock loop 200 is in the operational mode. The controlled oscillator 265 generates the controlled oscillator signal 201 in response to the comparator output as modified in a conventional manner by the low pass filter 260 and the gain stage 240. The controlled oscillator 265, the low pass filter 260, and the gain stage 240 are conventional phase lock loop circuits. The gain stage may, for example, be a charge pump that converts the output of the phase-frequency detector to a current.

The switched tunable prescaler 280 comprises a switch 270, a direct current (DC) bias 275, and a tunable prescaler 220. In accordance with the preferred and first alternative embodiments of the present invention, the tunable prescaler 220 is a prescaler of the type described in U.S. Pat. No. 4,953,187, issued on Aug. 28, 1990 to Herold et al., and entitled "High Speed Prescaler", which is hereby incorporated herein by reference, having a prescaler input characteristic that is highly responsive to supply voltage variations and process variations, and somewhat responsive to ambient temperature changes. The prescaler 220 is implemented using a plurality of voltage amplification stages coupled in a feedback loop in a conventional manner. The switch 270 is coupled between the controlled oscillator signal 201 and the prescaler input and presents a low impedance path for the controlled oscillator signal 201 to the tunable prescaler 220 when the low power phase lock loop is in the operational state and otherwise presents high impedance path for the controlled oscillator signal 201 (i.e., is open circuit). The DC bias 275 is coupled to the input of the tunable prescaler 220 both during the tuning and the operational states. The switch 270 is a conventional transistor switch, such as a metal oxide semiconductor field effect transistor (MOSFET). It will be appreciated that alternative conventional configurations can be used to achieve the switching between the controlled oscillator signal 201 and a signal having no AC component with essentially the same effect.

The digital prescaler tuner 290 comprises a digital controller 225 and an adjustable converter 215. The adjustable converter 215 is coupled to a system power supply (system supply) 210, which provides power to the digital prescaler tuner 290, as well as other portions of the radio 500. In accordance with the preferred and first embodiments of the present invention, the system supply is a fixed, regulated voltage source that has a AAA battery as an energy source. The adjustable converter 215 converts the energy supplied by the AAA battery from the fixed, regulated voltage source to a variable voltage that is coupled to the tunable prescaler 220 as the tuning control signal 216, which not only controls the tuning of the tunable prescaler 220, but also supplies its power. The value of the variable voltage of the tuning control signal 216 is determined by a converter control signal 226 generated by the digital controller 225. The digital controller 225 is coupled to the frequency comparator 235, the mode controller 205, and the adjustable converter 215.

Figure 1:
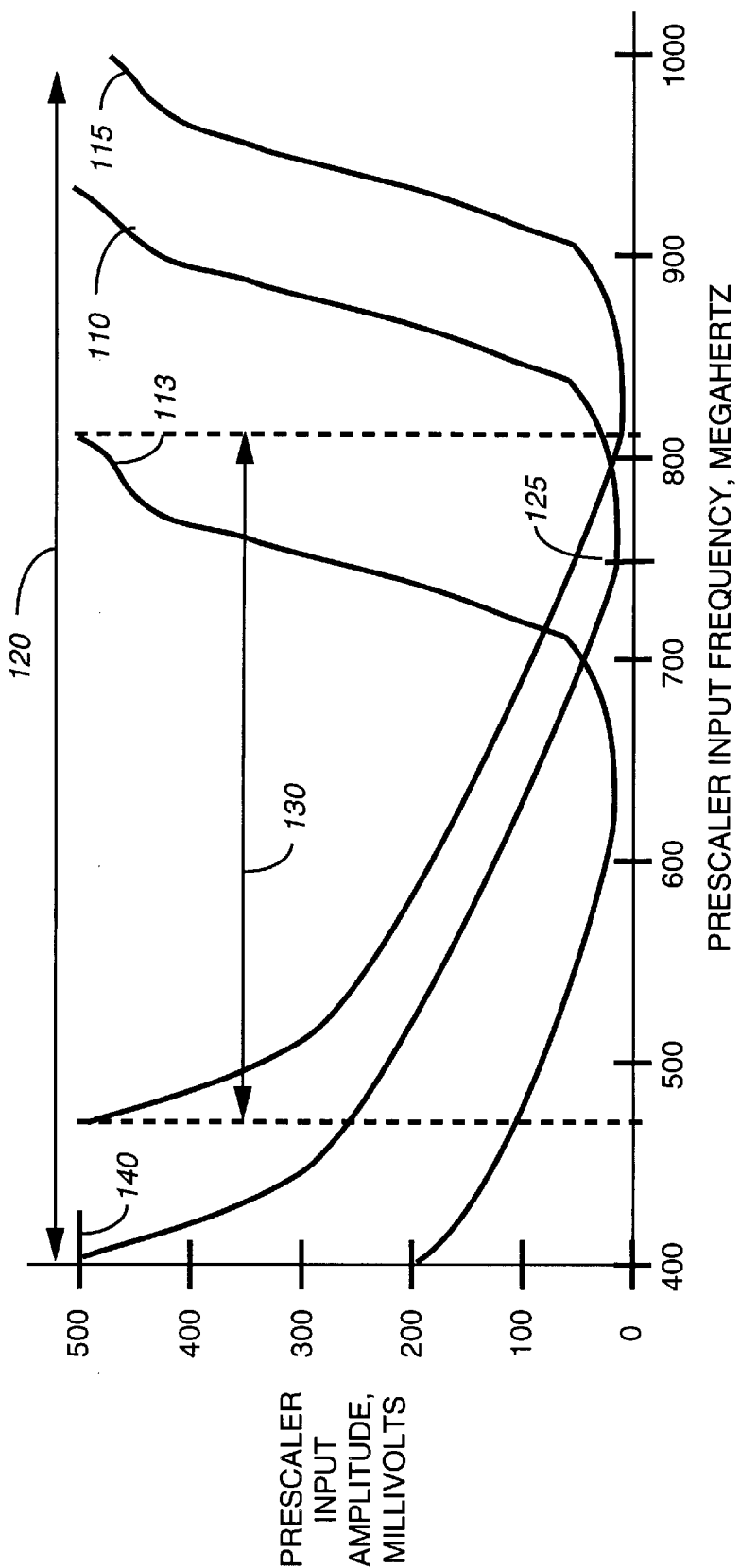
FIG. 1 is a graph on which input signal characteristics of a conventional frequency prescaler are plotted, in accordance with the preferred embodiment of the present invention.
Figure 3:
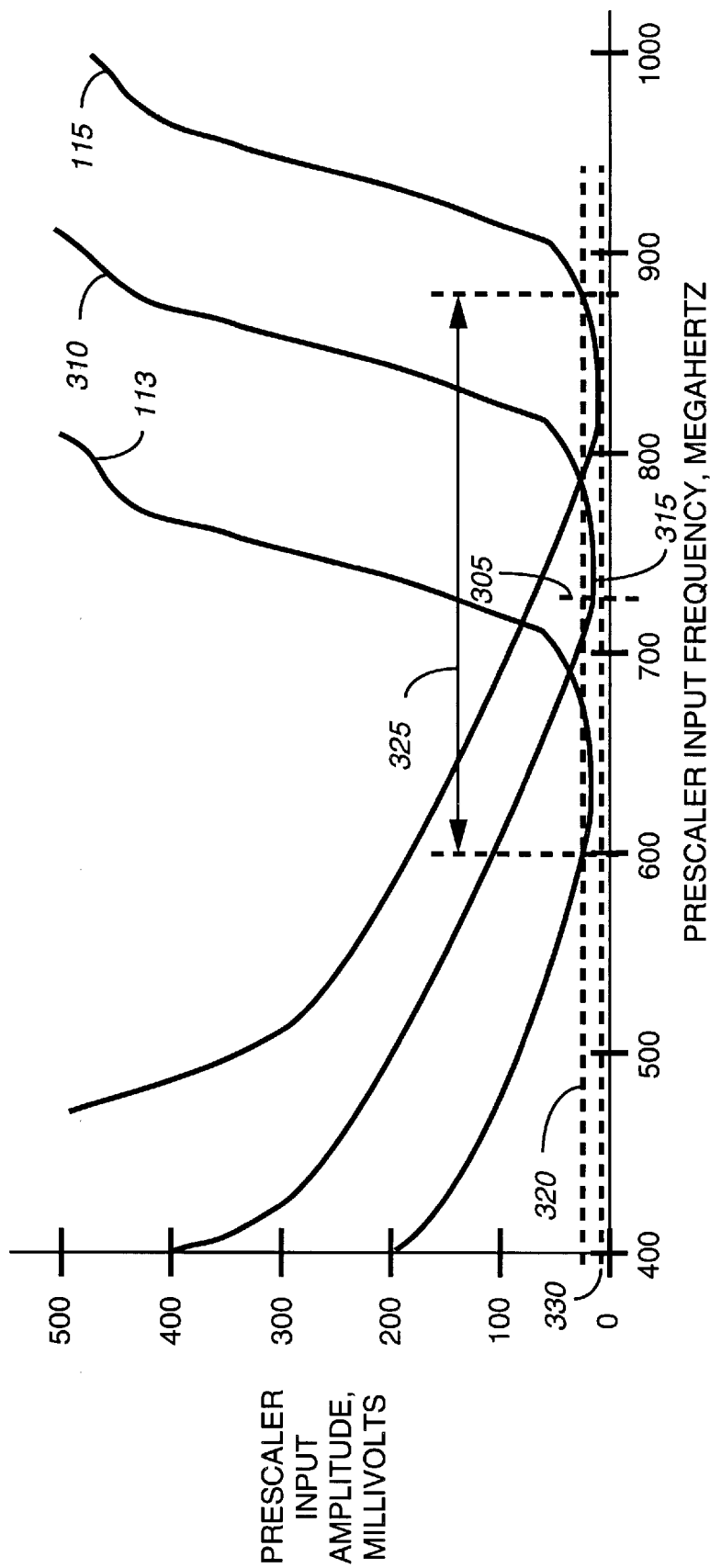
FIG. 3 is a graph on which input and operational characteristics of a frequency prescaler are plotted, in accordance with the preferred and first alternative embodiment of the present invention.

When the mode controller sets the state of the low power phase lock loop 200 to the tuning state, the switch 270 effectively removes the controlled oscillator signal 201 from the input to the tunable prescaler 220, which causes the tunable prescaler 220 to run at the free-running frequency as determined by the value of the tuning control signal 216 (which is also the voltage of the power supply 210), the ambient temperature, and the process characteristics of the silicon in which the tunable prescaler has been fabricated. The digital controller 225 adjusts the converter control signal 226 to alter the tuning control signal 216 to eventually reduce the difference of the reference frequency and the free-running prescaler output frequency to be less than a predetermined minimum amount. This situation is shown in FIG. 3, which is graph on which input and operational characteristics of the tunable prescaler 220 are plotted in accordance with the preferred and first alternative embodiment of the present invention. The minimum and maximum shifts 113, 115 of the input characteristic are the same as shown in FIG. 1. The reference frequency is indicated by the vertical line 305. The tuning process has shifted the input characteristic 310 such that its divided free running frequency is essentially equal to the divided reference frequency, and therefore the minimum of the input characteristic 315 occurs essentially at the frequency which is equal to the divider value of the frequency divider 230 times the frequency of the output of the frequency divider 255. It will be appreciated that a very low amplitude (a first predetermined amplitude) 320 of the AC component of the prescaler input signal 219 exists such that when the free-running frequency of the tunable prescaler is tuned to differing frequencies, the low power phase lock loop 200 can be operated over a wide frequency range 325 using the very low amplitude 320 of the prescaler input signal 219. It will be further appreciated that there is an even lower amplitude (a second predetermined amplitude) 330 of the AC component of the prescaler input signal 219, which is near to but not necessarily equal to zero volts, below which the tunable prescaler will operate at the free-running frequency, and be responsive to the power supply, process, and temperature parameters, and thus be tunable. The switch 270 and DC bias circuit 275 are designed to ensure that the AC component of the prescaler input signal 219 is below the second predetermined amplitude 330 during the tuning state.

In accordance with the preferred and first alternative embodiments of the present invention, the output of the frequency comparator 235 is a first binary state when the difference is positive and is a second binary state when the difference is negative. The value of the tuning control signal 216 is preferably proportional to the value of the converter control signal 226. The digital controller 225 uses a conventional binary search algorithm to alter the tuning control signal 216 until the difference of the reference frequency and the prescaler output frequency is less than the predetermined minimum amount. It will be appreciated that alternative conventional algorithms could be used for tuning with little change in efficacy. The digital controller 225 generates a completion signal that is coupled to the mode controller 205 when the digital controller 225 has completed its adjustment of the tunable prescaler 220. The mode controller 205 then sets the state of the low power phase lock loop to the operational state, which effectively reconnects the controlled oscillator signal 201 to the tunable prescaler 220. The digital controller 225 holds the value of the converter control signal 226 during the operational state of the low power phase lock loop 200, which keeps the prescaler in a mode in which its free running frequency is approximately equal to that of the frequency reference.

The mode controller 205 and digital controller 225 are each preferably implemented in a custom logic circuit, although they could alternatively be implemented as segments of program instructions that control the operation of a microprocessor. In accordance with the preferred embodiment of the present invention, the adjustable converter 215 is a voltage regulator of conventional design, that generates a low power supply voltage that has a value in proportion to the converter control signal 226. The digital controller 225 preferably includes a digital to analog converter that converts an internal digital result to the converter control signal 226 as an analog signal. It will be appreciated that there are alternative approaches for controlling the adjustable converter 215, such as an approach in which the adjustable converter 215 has a digitally controlled gain and the converter control signal 226 is a parallel binary digital signal.

It will be appreciated that the switched tunable prescaler 280, in accordance with the preferred embodiment of the present invention, can be more generically characterized as being source voltage powered and source voltage tuned, wherein the prescaler tuner 290 generates the tuning control signal as a source voltage having a voltage value that is determined in response to the comparator output.

In the first alternative embodiment of the present invention, the tunable prescaler 220 is implemented in a conventional manner using a plurality of current amplifiers (instead of voltage amplifiers) coupled in a feedback loop. In such a case, the adjustable converter 215 is controlled by the converter control signal 226 to adjust the current instead of the voltage of the tuning control signal 216, although in both cases, the tuning control signal 216 supplies the power necessary to run the tunable prescaler 220. In accordance with the first alternative embodiment of the present invention, the switched tunable prescaler 280 can be more generically characterized as being source current powered and source current tuned, wherein the prescaler tuner 290 generates the tuning control signal as a source current having a current value that is determined in response to the comparator output.

Figure 4:
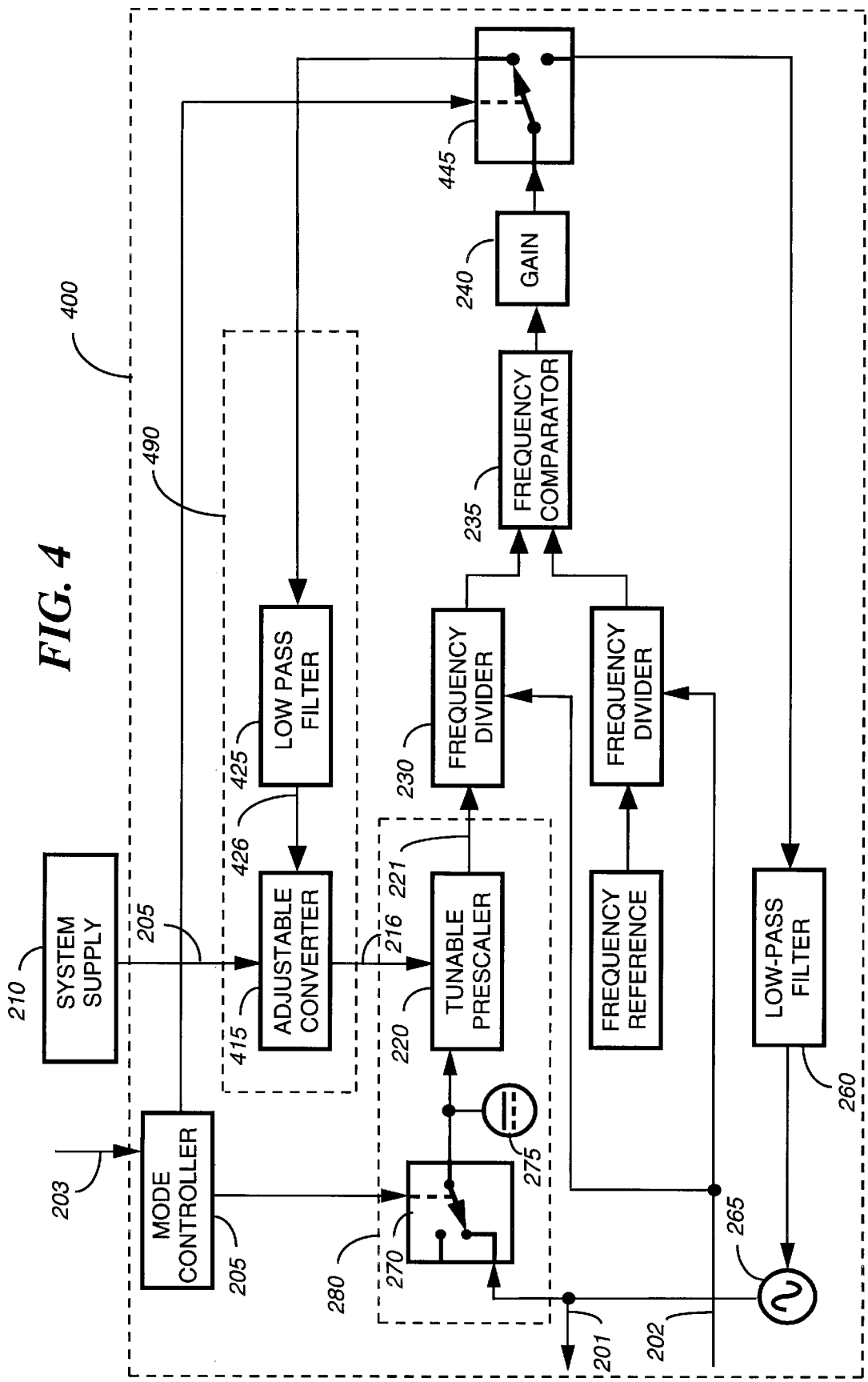
FIG. 4 is an electrical block diagram of a low power phase lock loop, in accordance with the second alternative embodiment of the present invention.

Referring to FIG. 4, an electrical block diagram of a low power phase lock loop 400 is shown, in accordance with a second alternative embodiment of the present invention. The low power phase lock loop 400 comprises the same circuit elements as the low power phase lock loop 200 (either the preferred or the first alternative embodiment), with differences being that the low power phase lock loop 400 comprises an analog prescaler tuner 490 instead of a digital prescaler tuner 290, and comprises an added switch 445. The switch 445, which is coupled to the mode controller 205, couples the analog output of the gain stage 240 to the low pass filter 425 during the tuning state, and to the low pass filter 260 during the operational state. The low pass filter 425 has the same characteristics as the low pass filter 260. The switch 445 preferably comprises MOSFETs, but other conventional designs such as those using bipolar emitter coupled logic (ECL), or gallium arsenide field effect transistors (MESFETs) can alternatively be used. The adjustable converter 415 is compatible with an analog converter control 426 generated by the low pass filter 425. The second alternative embodiment thus functions in much the same way as the preferred embodiment, the significant difference being the use of more analog circuitry and less (custom) logic circuitry than in the preferred embodiment.

Figure 5:
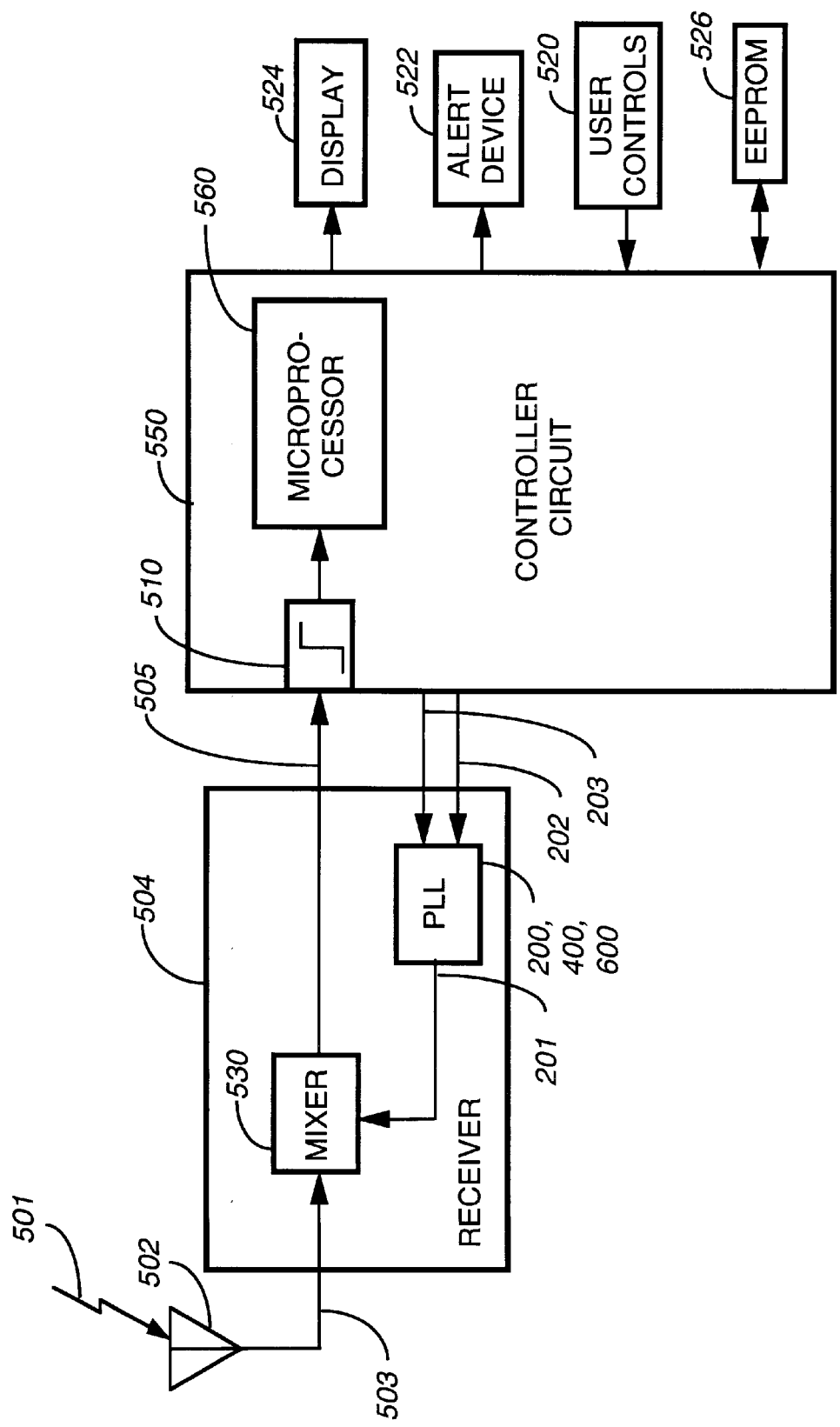
FIG. 5 is an electrical block diagram of a radio receiver, in accordance with the preferred and alternative embodiments of the present invention.

Referring to FIG. 5, an electrical block diagram of a radio 500 is shown, in accordance with the preferred and alternative embodiments of the present invention. The radio 500 is a selective call radio that includes an antenna 502 for intercepting a radiated signal 501. The antenna 502 converts the intercepted radiated signal 501 to a conducted radio signal 503 that is coupled to a receiver 504 wherein the conducted radio signal 503 is received. The receiver 504 is a zero IF (intermediate frequency) receiver that comprises a mixer 530, one of the low power phase lock loops 200, 400, 600 described herein (phase lock loop 600 is described below). The low power phase lock loop 200, 400, 600 generates the controlled oscillator signal 201 that is, in this case, a local oscillator (LO) signal. The controlled oscillator signal 201 is coupled to the mixer 530, wherein it mixes with the conducted radio signal. The resulting intermediate frequency signal, which in this case is a baseband signal, is coupled as a demodulated signal 505 to the controller 550. The controller circuit 550 is coupled to a display 524, an alert 522, a set of user controls 520, and an electrically erasable read only memory (EEPROM) 526. The controller circuit 550 comprises a digital conversion circuit 510 and a microprocessor 560. The demodulated signal 505 is coupled to the digital conversion circuit 510 wherein it is converted to a binary signal that is coupled to the microprocessor 560. The microprocessor 560 is coupled to the EEPROM 526 for storing an embedded address stored therein during a maintenance operation and for loading the embedded address during normal operations of the radio 500. The microprocessor 560 is a conventional microprocessor comprising a central processing unit (CPU), a read only memory (ROM), and a random access memory (RAM).

A message processor function of the microprocessor 560 decodes outbound words and processes an outbound message when an address received in the address field of the outbound signaling protocol matches the embedded address stored in the EEPROM 526, in a manner well known to one of ordinary skill in the art for a selective call radio. An outbound message that has been determined to be for the radio 500 by the address matching is processed by the message processor function according to the contents of the outbound message and according to modes set by manipulation of the set of user controls 520, in a conventional manner. An alert signal is typically generated when an outbound message includes user information. The alert signal is coupled to the alert device 522, which is typically either an audible or a silent alerting device.

When the outbound message includes alphanumeric or graphic information, the information is displayed on the display 524 in a conventional manner by a display function at a time determined by manipulation of the set of user controls 520.

It will be appreciated that the low power phase lock loops described herein in accordance with the preferred and alternative embodiments of the present invention provide equivalent benefits when used with other types of radios 500 and radio receivers 504, such as single or dual conversion super-heterodyne receivers.

Figure 6:
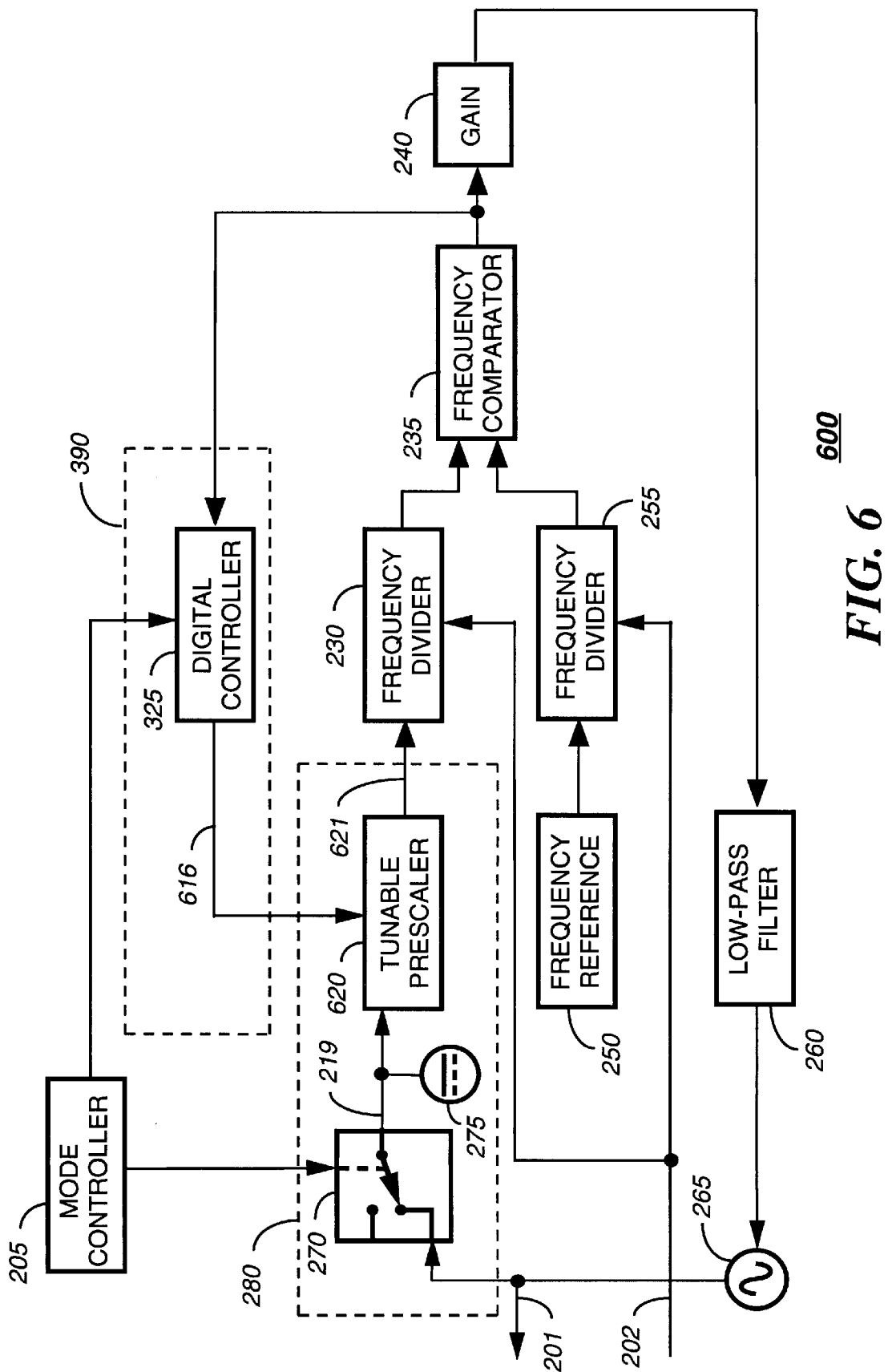
FIG. 6 is an electrical block diagram of a low power phase lock loop, in accordance with a third alternative embodiment of the present invention.

Referring to FIG. 6, an electrical block diagram of a low power phase lock loop 600 is shown, in accordance with a third alternative embodiment of the present invention. The low power phase lock loop 600 provides the same functions as the low power phase lock loop 200, and comprises the same circuit elements as the low power phase lock loop 200 (either the preferred or the first alternative embodiment), with differences being that the low power phase lock loop 600 comprises a load tunable prescaler 620 instead of the (power supply voltage or current) tunable prescaler 220, and has no adjustable converter 215. The load tunable prescaler 620 generates a prescaler output signal 621 that, like the prescaler output signal 221, is a prescaled version of the prescaler input signal 219. The load tunable prescaler 620 is tuned during the tuning phase by a tuning control signal 616 that is generated directly by the digital controller 225. In a fourth alternative embodiment, the low power phase lock loop 600 is similar to the low power phase lock loop 400, and the tuning control signal 616 is generated directly by the low pass filter 425.

Figure 7:
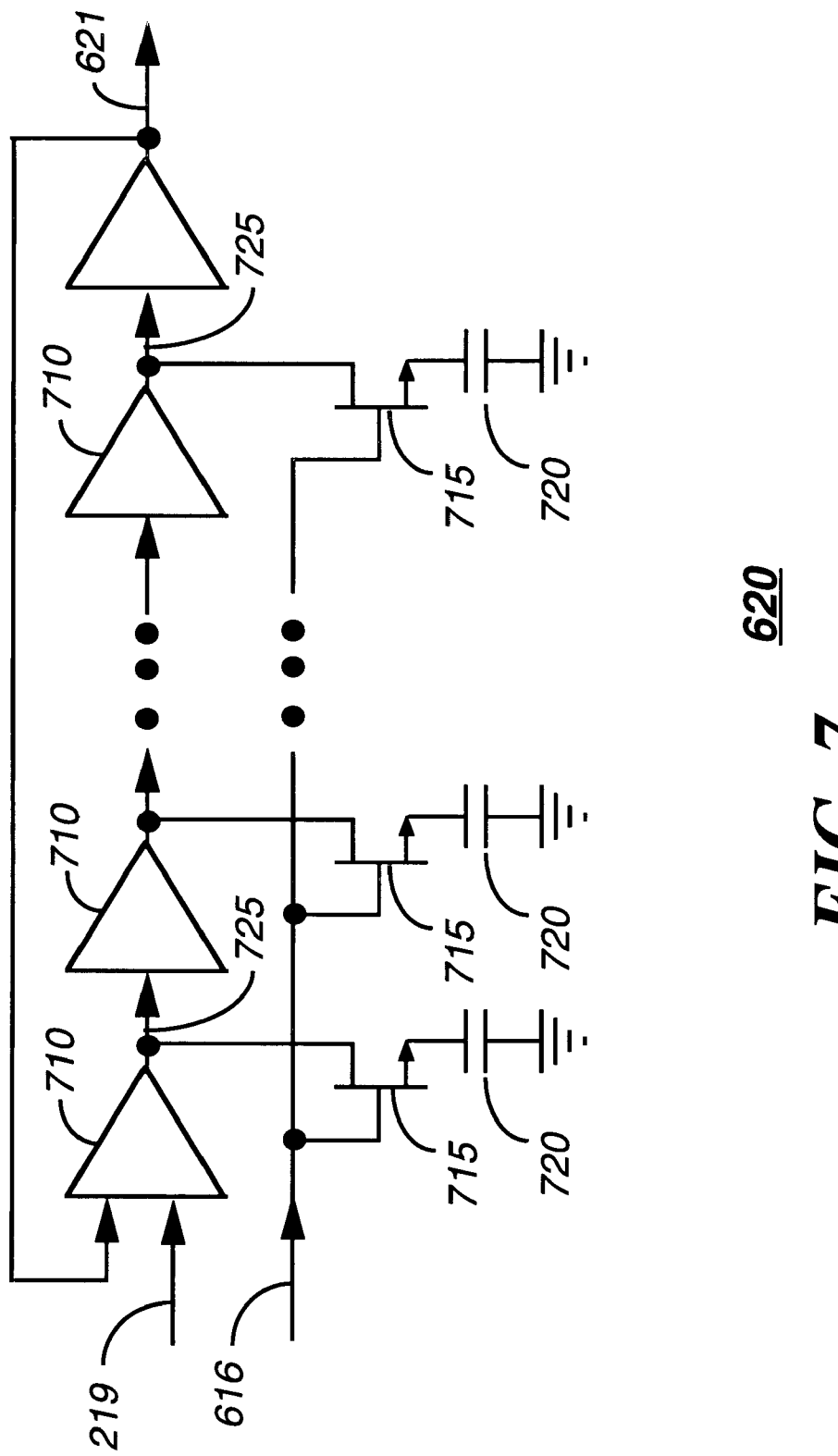
FIG. 7 is an electrical block diagram of a load controlled tunable prescaler used in the low power phase lock loop of FIG. 6, in accordance with third and fourth alternative embodiments of the present invention.

Referring to FIG. 7, an electrical block diagram of the load controlled tunable prescaler 620 is shown, in accordance with the third and fourth alternative embodiments of the present invention. The load controlled tunable prescaler 620 comprises a plurality of switched amplifier stages 710 coupled in a feedback loop, a plurality of interstage load control transistors 715 and an associated plurality of load capacitors 720. The interstage load control transistors 715 are each coupled to the tuning control signal 616, which in other words is a load control signal. As the voltage of the tuning control signal 616 is increased, the impedance of the interstage load control transistors 715 is changed, which changes the loading of the interstage couplings 725. This causes a frequency shift of the input characteristics similar to that described with reference to FIG. 3, which also shifts the free-running frequency of the load controlled tunable prescaler 620.

While the tuned phase lock loops 200, 400, 600 have been described above as being used in conjunction with a radio receiver, it will be appreciated that the tuned phase lock loops 200, 400, 600 are equally beneficial for use in many other electronic devices, such as infra-red or optical receivers, or magnetic disk drive read write channel circuits or microprocessor internal clock distribution circuits.

Referring to FIG. 8, an electrical block diagram of a low input drive level prescaler 800 is shown, in accordance with a fifth alternative embodiment of the present invention. The low input drive level prescaler 800 comprises the circuit elements of the low power phase lock loop 200 described with reference to FIG. 2, except that the frequency dividers 230, 255, the gain stage 240, the low pass filter 260, and the controlled oscillator 265 are not included in the low input drive level prescaler 800. The prescaler input signal 219 during the operational state is an external input signal 801, instead of the controlled oscillator signal 201. The low input drive level prescaler 800 is tuned during a tuning state that is initiated by the retune signal 203. A prescaled output signal 804 is generated that is a prescaled version of the external input signal 801 during the operational state and that is the free-running frequency of the tunable prescaler 220 during the tuning state. It will be appreciated that the low input drive level prescaler 800 is essentially a subset of the low power phase lock loop 200. It will be further appreciated that an equivalent subset of the low power phase lock loop 400 and the load controlled phase lock 600 exist as yet other alternative embodiments of the present invention. The low input prescaler 800 (and the other alternative tuned prescalers) are usable not only as a portion of a phase lock loop, but also in other applications, such as a frequency prescaler in the front end of a receiver, to bring a frequency of an intercepted signal down to a frequency that is better managed by conversion circuits, without first performing a mixing of the intercepted signal. It will be appreciated that the circuits of the low power phase lock loops 200, 400, 600 and the low input drive level prescaler 800 can be realized using essentially any circuit technology suitable for such low power, high speed applications, such as CMOS, emitter coupled logic (ECL) or gallium arsenide FETs (MESFETS).

By now it will be appreciated that there has been provided by the embodiments of the present invention, prescalers that are responsive to input signals having low amplitude AC components and phase lock loops that use the prescalers. Circuits using the prescalers and phase lock loops in accordance with the embodiments of the present invention thus use less power than circuits using prior art prescalers and phase lock loops.

We claim:

1. A low power phase lock loop, comprising:

a switched tunable prescaler that generates a prescaler output signal having a prescaler output frequency that is a prescaled frequency of a controlled oscillator signal during an operational state of the low power phase lock loop and having a free-running frequency responsive to a tuning control signal during a tuning state of the low power phase lock loop;

a frequency comparator that is coupled to a reference signal having a reference frequency and to the prescaler output signal, and that generates a comparator output in response to a difference between the reference frequency and the prescaler output frequency;

a prescaler tuner that is coupled to the switched tunable prescaler, that adjusts the tuning control signal in response to the comparator output during the tuning state to minimize the difference between the reference frequency and the prescaler output frequency, and that holds the tuning control signal during the operational state; and a controlled oscillator that is coupled to the frequency comparator and that generates the controlled oscillator signal in response to the comparator output.

2. The low power phase lock loop according to claim 1, further comprising:

a mode controller coupled to the switched tunable prescaler that sets the low power phase lock loop to the tuning state in response to a retune signal.

3. The low power phase lock loop according to claim 1, wherein the switched tunable prescaler comprises:

a tunable prescaler that generates the prescaler output signal when a prescaler input signal of the tunable prescaler has an alternating current (AC) component above a first predetermined amplitude, and wherein the prescaler output frequency is responsive to a tuning control signal during the tuning state when the prescaler input signal has an AC component below a second predetermined amplitude; and a prescaler input switch that is coupled to the controlled oscillator signal and the tunable prescaler, wherein the prescaler input switch couples the controlled oscillator signal to the tunable prescaler as a prescaler input signal during the operational state and decouples the controlled oscillator signal from the tunable prescaler during the tuning state.

4. The low power phase lock loop according to claim 3, wherein the switched tunable prescaler is source voltage powered and source voltage tuned, and wherein the prescaler tuner generates the tuning control signal as a source voltage having a voltage value that is determined in response to the comparator output.

5. The low power phase lock loop according to claim 3, wherein the switched tunable prescaler is source current powered and source current tuned, and wherein the prescaler tuner generates the tuning control signal as a source current having a current value that is determined in response to the comparator output.

6. The low power phase lock loop according to claim 3, wherein the switched tunable prescaler is load controlled, and wherein the prescaler tuner generates the tuning control signal as a load control signal that is determined in response to the comparator output.

7. The low power phase lock loop according to claim 3, wherein the prescaler tuner comprises a digital controller that generates the tuning control signal.

8. The low power phase lock loop according to claim 3, wherein the prescaler tuner comprises analog gain and low pass filter circuits that generate the tuning control signal.

9. An electronic device comprising the phase lock loop according to claim 1.

10. A low input drive level prescaler responsive to input signals having low amplitude alternating current (AC) components, comprising:

a switched tunable prescaler that generates an output signal having a prescaler output frequency that is a prescaled frequency of an input signal during an operational state of the low input drive level prescaler and that is a free-running frequency responsive to a tuning control signal during a tuning state of the low input drive level prescaler;

a frequency comparator coupled to a reference signal and the output signal that generates a comparator output in response to a difference between the reference frequency and the prescaler output frequency; and a prescaler tuner that is coupled to the switched tunable prescaler and adjusts the tuning control signal in response to the comparator output during the tuning state to minimize the difference between a reference frequency and the prescaler output frequency, and holds the tuning control signal during the operational state.

11. The low input drive level prescaler according to claim 10, wherein the switched tunable prescaler comprises:

a tunable prescaler that generates the prescaler output signal when a prescaler input signal of the tunable prescaler has an alternating current (AC) component above a first predetermined amplitude, and wherein the prescaler output frequency is responsive to a tuning control signal during the tuning state when the prescaler input signal has an AC component below a second predetermined amplitude; and a prescaler input switch that is coupled to the input signal and the tunable prescaler, wherein the prescaler input switch couples the input signal to the tunable prescaler as the prescaler input signal during the operational state and decouples the controlled oscillator signal from the tunable prescaler during the tuning state.

12. A method for operating a low input drive level prescaler that provides response to input signals having low amplitude alternating current (AC) components, wherein the low input drive level prescaler comprises a switched tunable prescaler, a frequency comparator, and a prescaler tuner, the method comprising the steps of:

generating an output signal having a prescaler output frequency that is a prescaled frequency of an input signal during an operational state of the low input drive level prescaler and that is a free-running frequency responsive to a tuning control signal during a tuning state of the low input drive level prescaler;

generating a comparator output in response to a difference between a reference frequency and the prescaler output frequency;

adjusting the tuning control signal in response to the comparator output during the tuning state to minimize the difference between the reference frequency and the prescaler output frequency; and holding the tuning control signal during the operational state.

13. The method according to claim 12, further comprising the step of:

setting the low input drive level prescaler to the tuning state in response to a retune signal.

14. The method according to claim 12, further comprising the steps of generating the tuning control signal as a source voltage having a voltage value that is determined in response to the comparator output;

powering the low input drive level prescaler by the source voltage; and tuning the low input drive level prescaler by the source voltage.

15. The method according to claim 12, further comprising the steps of generating the tuning control signal as a source current having a current value that is determined in response to the comparator output;

powering the low input drive level prescaler by the source current; and tuning the low input drive level prescaler by the source current.

16. The method according to claim 12, further comprising the step of generating the tuning control signal as a load control signal that is determined in response to the comparator output.

* * * * *